(12) United States Patent
Sugarman et al.

(10) Patent No.: US 6,520,315 B1
(45) Date of Patent: Feb. 18, 2003

(54) GRIPPER ASSEMBLY

(75) Inventors: Michael Sugarman, San Francisco, CA (US); Boris I. Govzman, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/698,821

(22) Filed: Oct. 26, 2000

(51) Int. Cl.[7] .............................................. B65G 47/24

(52) U.S. Cl. ............... 198/379; 198/867.05; 198/803.7; 294/88; 414/939

(58) Field of Search .................. 198/803.7, 867.05, 198/750.11, 379; 414/751.1, 753.1, 939; 294/88

(56) References Cited

U.S. PATENT DOCUMENTS

| | | | | |
|---|---|---|---|---|
| 4,943,099 A | * | 7/1990 | Gabriel | 294/88 |
| 5,902,088 A | * | 5/1999 | Fairbain et al. | 414/939 |
| 6,076,875 A | * | 6/2000 | Neff et al. | 294/88 |

* cited by examiner

*Primary Examiner*—Joseph E. Valenza
(74) *Attorney, Agent, or Firm*—Dugan & Dugan (57) ABSTRACT

The invention provides a gripper assembly comprising a mounting base having a first magnet coupled thereto and having a moveable gripper coupled to the mounting base. The moveable gripper has a second magnet coupled thereto and comprises an end effector adapted to contact a wafer. The first and second magnets are adapted so that the magnetic force therebetween biases the end effector away from the mounting base. An inventive method of gripping a substrate comprises coupling a moveable gripper to a mounting base and magnetically biasing the moveable gripper in a closed position.

18 Claims, 7 Drawing Sheets

GRIPPER ASSEMBLY

FIELD OF THE INVENTION

The present invention relates to an improved gripper for supporting an object. More specifically, the present invention relates a gripper for supporting a thin disk such as a glass substrate, a flat panel display, a patterned or unpatterned semiconductor substrate, and the like particularly during a cleaning process.

BACKGROUND OF THE INVENTION

Semiconductor substrates are often cleaned within a tank of fluid (or a bath) followed by a rinsing process (e.g., by submersing the substrate in rinsing fluid, or by spraying the substrate with rinsing fluid). A drying apparatus such as a spin-rinse-dryer (SRD) is typically used to rinse and to dry a substrate.

Spin-rinse-dryers typically include a flywheel adapted to spin a substrate and a plurality of grippers attached to the flywheel and adapted to support a substrate thereon. The flywheel spins the substrate while the substrate is sprayed with rinsing fluid, and, after the fluid spray ceases, spin dries the substrate. The grippers which hold the substrate in place on the flywheel, may move between an open and closed position. In the open position, a substrate handler may place a substrate on the grippers and also may extract a rinsed and dried substrate therefrom. In the closed position, the grippers may clamp a substrate in place on the flywheel. As the grippers move between the open and closed position, precise repeatable positioning of the grippers is essential in order to avoid damaging a substrate by grasping it too tightly or allowing a substrate to become unseated from the flywheel by grasping the substrate too loosely. The mechanical parts used to open and close many conventional grippers are subject to wear, which may result in unrepeatable gripping as well as creating particles which may contaminate the substrate.

Accordingly, a need exists for an improved gripper.

SUMMARY OF THE INVENTION

The invention provides a gripper assembly comprising a mounting base having a first magnet coupled thereto and having a moveable gripper coupled to the mounting base. The moveable gripper has a second magnet coupled thereto and comprises an end effector adapted to contact a wafer. The first and second magnets are adapted so that the magnetic force therebetween biases the end effector away from the mounting base. An inventive method of gripping a substrate comprises coupling a moveable gripper to a mounting base and magnetically biasing the moveable gripper in a closed position.

Other features and aspects of the present invention will become more fully apparent from the following detailed description of the preferred embodiments, the appended claims and the accompanying drawings.

DETAILED DESCRIPTION OF THE PREFERRED EMBODIMENTS

An inventive gripper assembly that employs magnets to precisely position a moveable gripper is provided. The inventive gripper assembly comprises two main aspects. In the first aspect, the inventive gripper assembly employs repulsive magnets to bias a moveable gripper in a closed position, as described further below with reference to FIGS. 3A–B. In the second aspect, the inventive gripper assembly employs attractive magnets to bias a moveable gripper in a closed position as described further below with reference to FIGS. 4A–B. These aspects may be employed within any apparatus that grips a thin disk and may be particularly advantageous when employed within a conventional SRD of any orientation (e.g., horizontal or vertical). The inventive gripper assembly is described further below with reference to FIGS. 1 and 2, which show a vertically orientated flywheel in a front elevational view and a side cross-sectional view, respectively.

Figure 1:
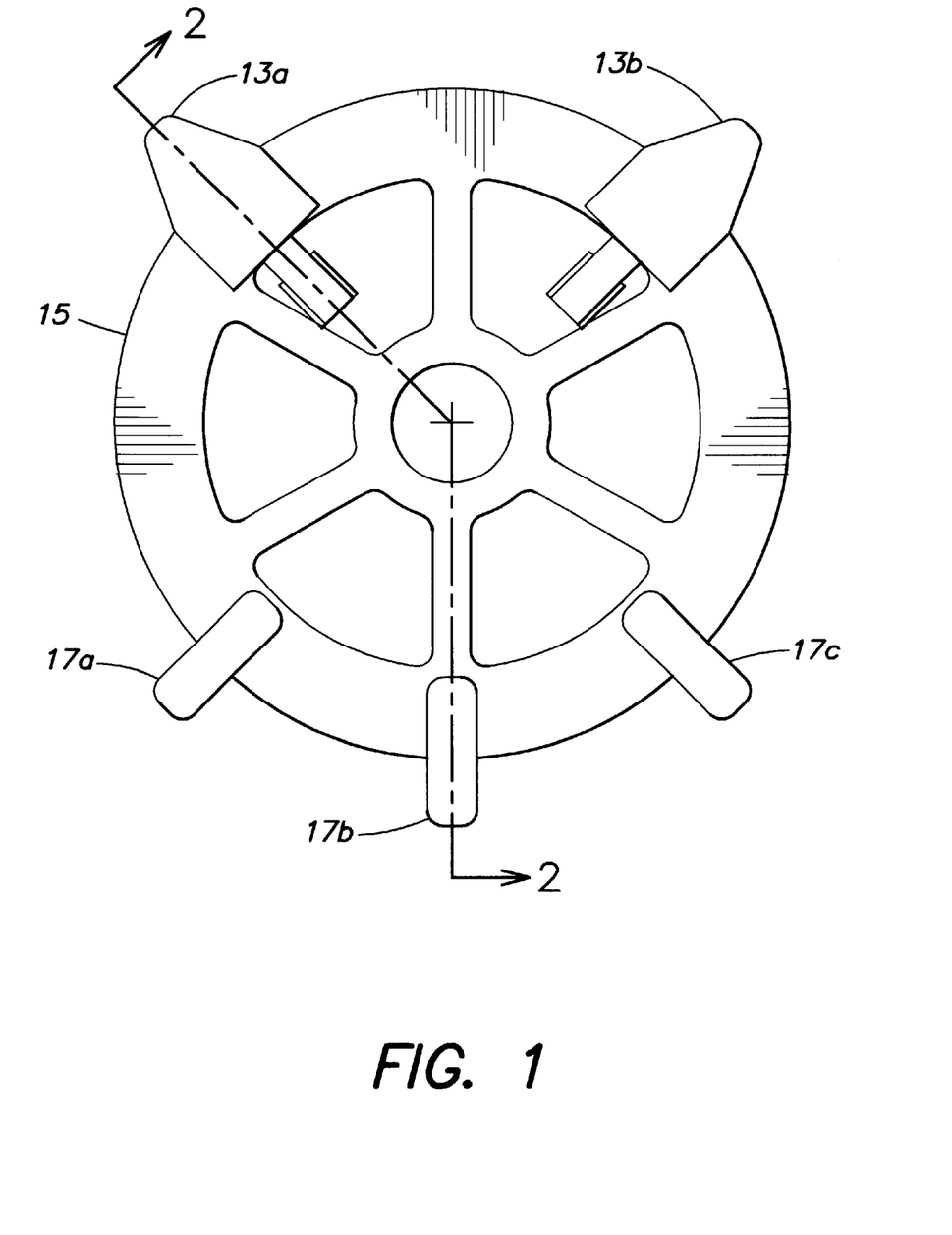
FIG. 1 is a front elevational view of a vertically positioned flywheel that employs a pair of inventive gripper assemblies.
Figure 2:
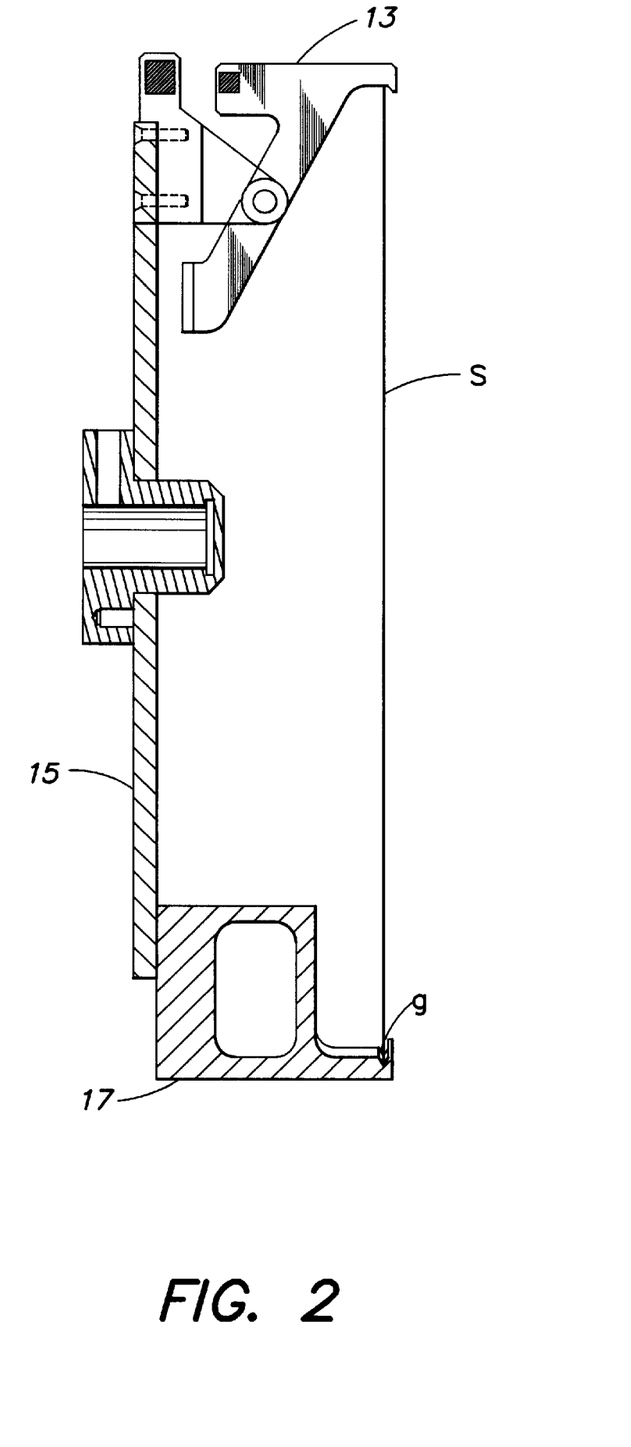
FIG. 2 is a cross-sectional view of the vertically positioned flywheel, taken along line 2—2 of FIG. 1.

FIG. 1 is a front elevational view of a vertically oriented flywheel 15 that employs a pair of inventive gripper assemblies 13a–b. FIG. 2 is a side cross-sectional view of the vertically oriented flywheel 15, taken along line 2—2 of FIG. 1. As shown in FIG. 1, the vertically oriented flywheel 15 also employs three fixed grippers 17a–c. The inventive gripper assemblies 13a–b and the fixed grippers 17a–c are coupled to the flywheel 15, which is adapted to spin a substrate 9 (FIG. 2). For simplicity, the substrate S is shown only in FIG. 2. The inventive gripper assemblies 13a–b may move between an open and closed position. In the open position, a substrate handler (not shown) may place a substrate S within a groove g on the fixed grippers 17a–c and also may extract a rinsed and dried substrate S therefrom. In the closed position, the inventive gripper assemblies 13a–b may clamp a substrate S that has been placed on the fixed grippers 17a–c.

In operation, a substrate handler (not shown) lowers a substrate S and places the substrate S within the groove g on the fixed grippers 17a–c. The fixed grippers 17a–c support the substrate S in a fixed position. The inventive gripper assemblies 13a–b gradually close as described with reference to the aspects of FIGS. 3A–4B, thus clamping the substrate S. Thereafter, the flywheel 15 may rotate while the substrate S is clamped thereto (e.g., while the substrate S is sprayed with rinsing fluid within an SRD, etc.). Thereafter, the inventive gripper assemblies 13a–b open as described with reference to the aspects of FIGS. 3A–4B, thus allowing a substrate handler to extract the substrate S from the vertically oriented flywheel 15.

The inventive gripper assembly 13 may employ repulsive magnets as described below with reference to FIGS. 3A–B, or the inventive gripper assembly 13 may employ attractive magnets as described below with reference to FIGS. 4A–B.

Figure 3A:
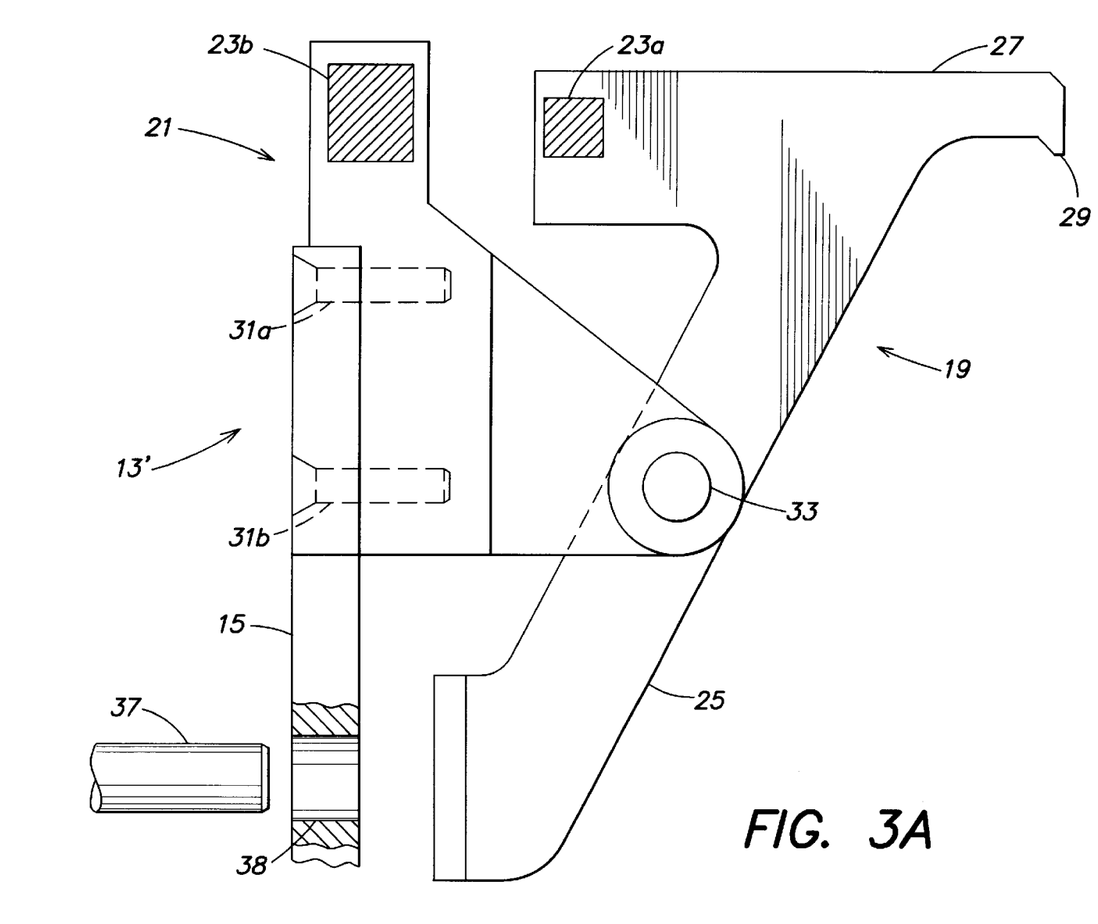
FIGS. 3A–B are close-up views of a first aspect of the inventive gripper assembly, which show the inventive gripper assembly in a closed and open position, respectively.
Figure 3B:
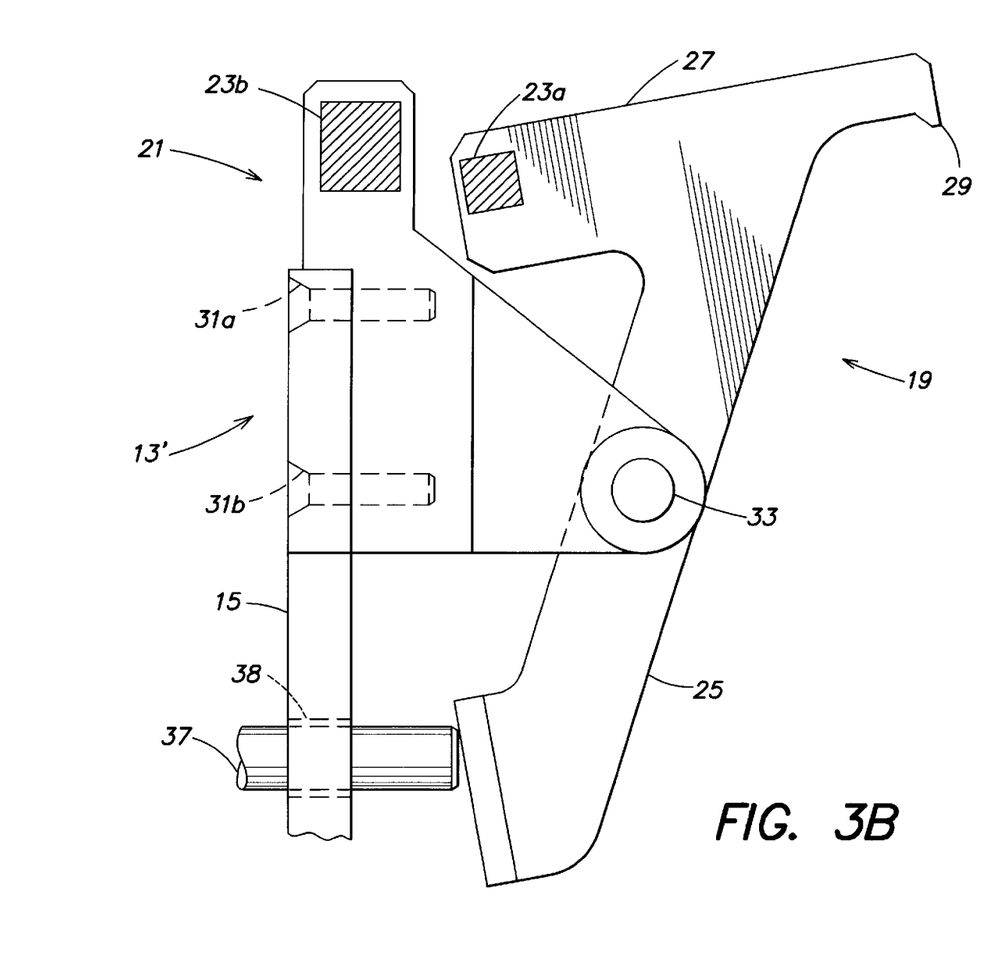

FIGS. 3A–B are close-up views of a first aspect 13[1] of the inventive gripper assembly, which show the inventive gripper assembly 13[1] in a closed and open position, respectively. The inventive gripper assembly 13[1] comprises a moveable gripper 19 and a mounting base 21. The inventive gripper assembly 13[1] further comprises a plurality of magnets 23a–b installed on the moveable gripper 19 and on the mounting base 21, respectively and positioned (e.g., with like poles facing each other) such that a repulsive force is generated therebetween (i.e., repulsive magnets).

The moveable gripper 19 comprises a first end 25, and a second end 27. The second end 27 further comprises an end effector 29. The end effector 29 is adapted to. support a substrate S. In one aspect, the magnet 23a is installed on the finger portion 27 and is positioned adjacent the magnet 23b installed on the mounting base 21 such that a repulsive force is generated therebetween (e.g., the north pole of the magnet 23a is facing the north pole of the magnet 23b), thereby biasing the second portion 27 away from the mounting base 21. The mounting base 21 may be coupled to the flywheel 15 via bolts 31a, 31b. The base portion 25 and the mounting base 21 may each have an aperture through which a shaft 33 extends so as to rotatably couple the moveable gripper 19 to the base portion 25. A moveable pin 37 (e.g., pneumatically, magnetically or motor driven) may selectively push the base portion 25 of the moveable gripper 19 away from the mounting base 21, thus overcoming the magnets' 23a–b repulsion and placing the inventive gripper assembly 13$^1$ in the open position as described below. The pin 37 may slide through an opening 38 in the backside of the flywheel 15 in order to contact the base portion 25 of the moveable gripper 19.

In operation the inventive gripper assembly 13$^1$ is initially in the closed position as shown in FIG. 3A. In operation, the pin 37 is driven forward and contacts the moveable gripper's base portion 25 to push the base portion 25 forward (away from the flywheel 15), thus causing the finger portion 27 of the moveable gripper 19 to move backward (toward the mounting base 21) as shown in FIG. 3B, which places the inventive gripper assembly 13 in the open position. The driving force of the pin 37 is sufficient to overcome the repulsive force of the magnets 23. A substrate handler (not shown) lowers a substrate S and places the substrate S on the fixed grippers 17a–c (FIG. 1) while the pins 37 maintain contact with the first portion 25 of the moveable gripper 19. Thereafter, an actuator (not shown) gradually retracts the pin 37 allowing the base portion 25 of the moveable gripper 19 to move backward therewith. Thus, the finger portion 27 of the moveable gripper 19 which has the magnet 23a in place thereon moves gradually forward (away from the mounting base 21 having the magnet 23b in place thereon), thus gradually closing the moveable gripper 19.

The magnetic force (e.g., repulsive) between the magnets 23a–b consistently pushes the finger portion 27 of the moveable gripper 19 away from the mounting base 21 to the closed position. The magnetic fields of the magnets 23a–b may be selected so as to achieve a desired repulsive force. Accordingly, the moveable gripper 19 may contact a substrate S and may maintain the closed position with force sufficient to overcome any opposing forces that may result as the flywheel 15 rotates. Thus, the inventive gripper assembly 13$^1$ may repeatably achieve a desired, closed position, and may do so without being subject to the wear or particle generation experienced by many conventional grippers.

As previously stated, a second aspect 13$^{11}$ of the inventive gripper assembly may employ attractive magnets (unlike the inventive gripper assembly 13$^1$ of FIGS. 3A–B that employs repulsive magnets). This aspect is described below with reference to FIGS. 4A–B.

Figure 4A:
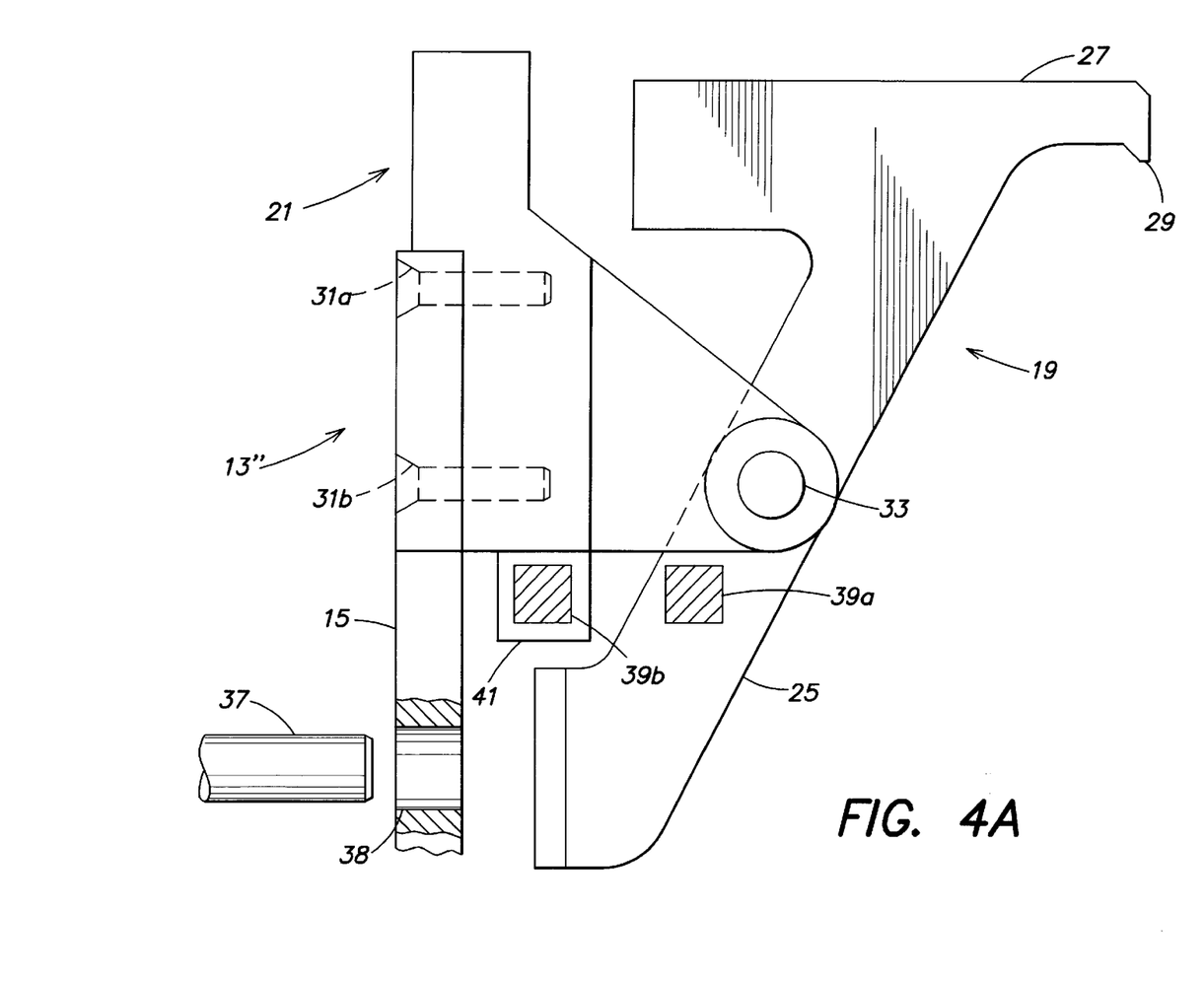
FIGS. 4A–B are close-up views of a second aspect of the inventive gripper assembly, which show the inventive gripper assembly in a closed and open position, respectively.
Figure 4B:
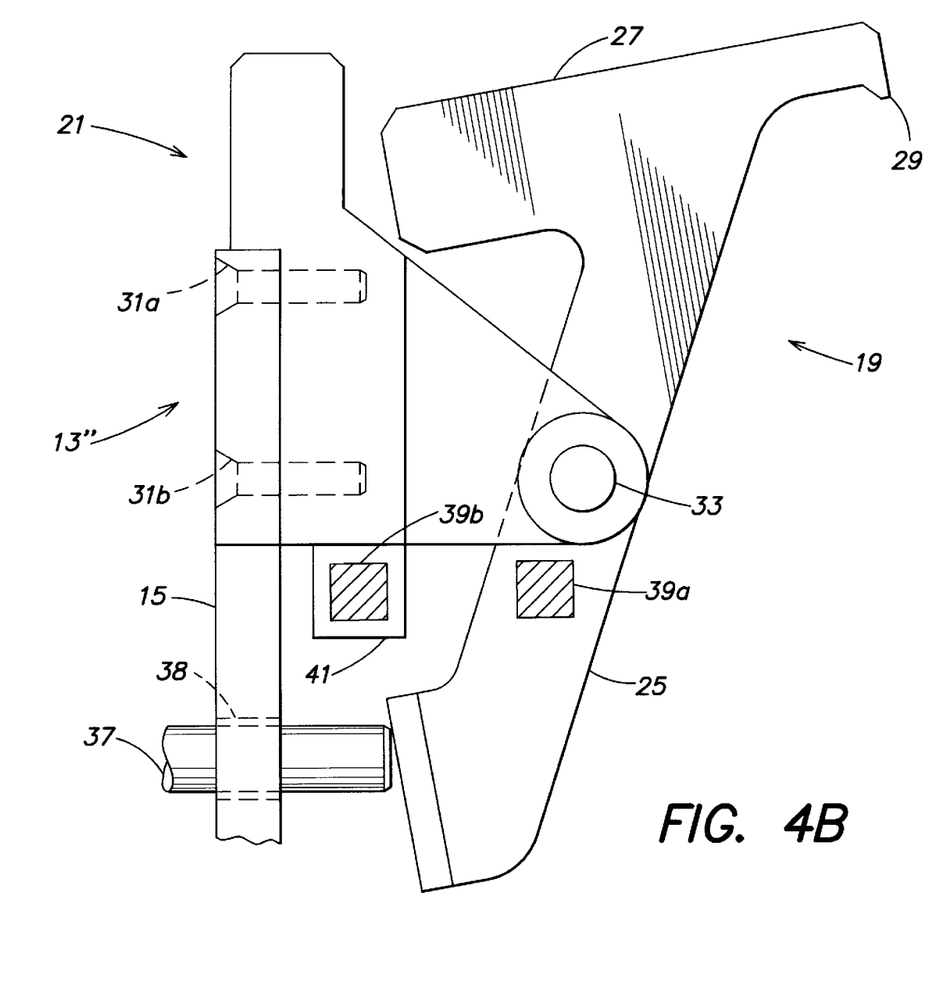

FIGS. 4A–B are close-up views of a second aspect 13$^{11}$ of the inventive gripper assembly, which show the inventive gripper assembly 13$^{11}$ in a closed and open position, respectively. The inventive gripper assembly 13$^{11}$ may comprise the same components as the inventive gripper assembly 13$^1$ of FIGS. 3A–B. In this aspect, however, the magnets 23a–b are replaced by magnets 39a–b which are positioned such that an attraction force is generated therebetween (attractive magnets). Also, the mounting base 21 has been configured to include an end portion 41 with the attractive magnet 39b in place thereon. The attractive magnet 39a is installed on the base portion 25 of the moveable gripper 19 and is positioned adjacent the attractive magnet 39b installed on the end portion 41 (e.g., the north pole of the attractive magnet 39a is facing the south pole of the attractive magnet 39b).

The operation of the inventive gripper assembly 13$^{11}$ is substantially identical to the operation of the inventive gripper assembly 13$^1$ described above, and is now described with reference to the sequential views of FIGS. 4A–B, which show the inventive gripper assembly 13$^{11}$ in the closed and open position, respectively. The inventive gripper assembly 13$^{11}$ is initially in the closed position as shown in FIG. 4A. Because the inventive gripper assembly 13$^{11}$ employs attractive magnets 39a–b, the magnetic attraction between the magnets 39a–b consistently moves the base portion 25 toward the mounting base 21 (unlike the inventive gripper assembly 13 of FIGS. 3A–B whereby the repulsive magnets 23 consistently move the finger portion 27 away from the mounting base 21), thus precisely positioning the moveable gripper 19 as described below.

In operation, the pin 37 is driven forward and contacts the moveable gripper's base portion 25 to push the base portion 25 forward (away from the flywheel 15), thus causing the finger portion 27 to move backward (toward the mounting base 21) as shown in FIG. 4B, which places the inventive gripper assembly 13$^{11}$ in the open position. The driving force of the pin 37 is sufficient to overcome the attractive force of the magnets 39a–b. A substrate handler (not shown) lowers a substrate S and places the substrate S on the fixed grippers 17a–c (FIG. 1). An actuator (not shown) gradually retracts the pin 37. As the pin 37 retracts, the base portion 25 of the moveable gripper 19 with the attractive magnet 39a in place thereon moves therewith (toward the mounting base 21 with the attractive magnet 39b in place thereon) due to attraction between magnets 39a–b. As the first portion 25 moves toward the mounting base 21, the finger portion 27 moves away from the mounting base 21, thus gradually closing the moveable gripper 19.

The magnetic force (e.g., attractive) between the magnets 39a–b consistently pulls the base portion 25 of the moveable gripper 19 toward the mounting base 21, thus biasing the moveable gripper 19 toward the closed position. The magnetic fields of the magnets 39a–b may be selected so as to achieve a desired attraction force. Accordingly, like the moveable gripper 19 of FIGS. 3A–B, the moveable gripper 19 of FIGS. 4A–B may contact a substrate S and may maintain the closed position with force sufficient to overcome any opposing force that may result as the flywheel 15 rotates. Thus, the inventive gripper assembly 13$^{11}$ may repeatably achieve a desired, closed position, and may do so without being subject to the wear or particle generation experienced by many conventional grippers.

Figure 5:
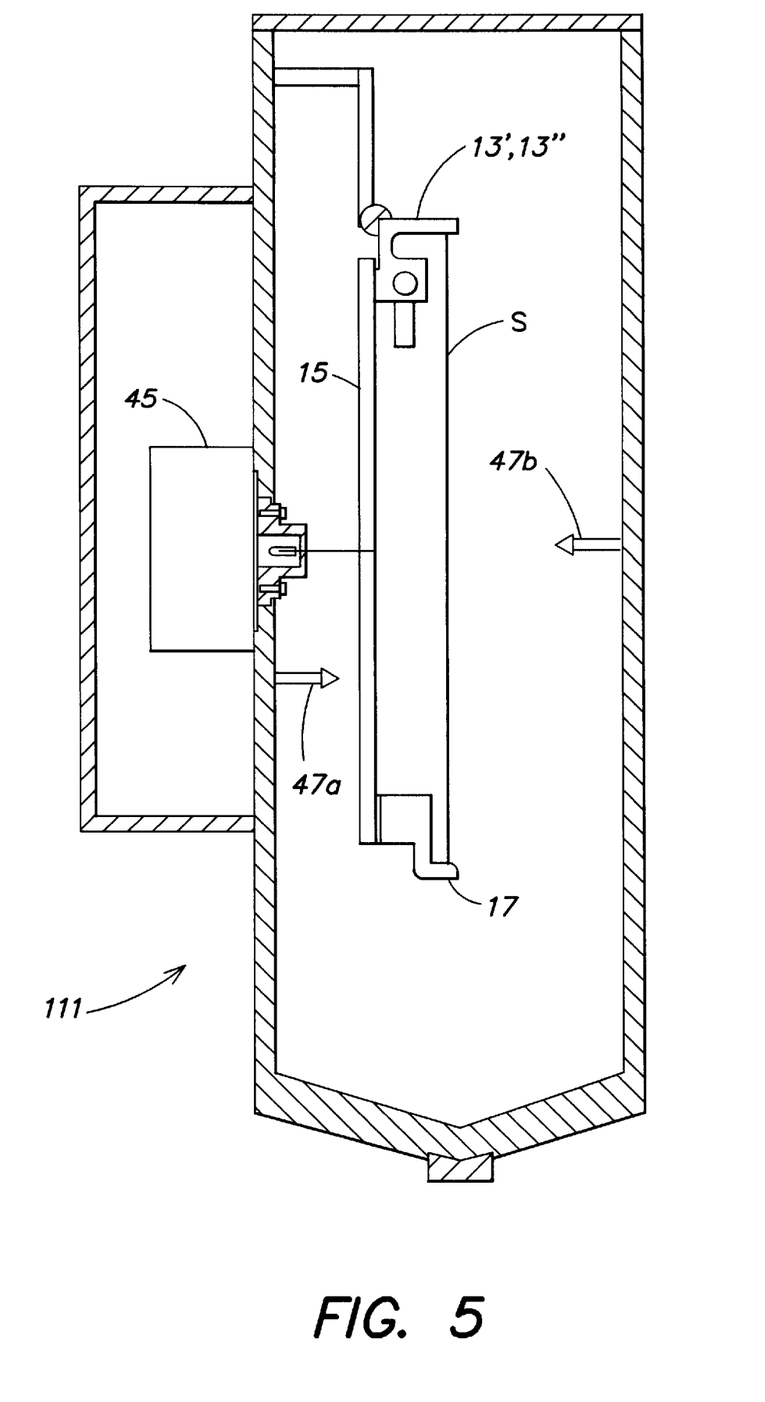
FIG. 5 is a side cross-sectional view of a vertical SRD that may employ either the inventive gripper assembly of FIGS. 3A–B or the inventive gripper assembly of FIGS. 4A–B.

FIG. 5 is a side cross-sectional view, of a vertical oriented SRD 111 that may employ either the inventive gripper assembly 13$^1$ of FIGS. 3A–B or the inventive gripper assembly 13$^{11}$ of FIGS. 4A–B. Within the vertical SRD 111, a substrate S is shown supported by the inventive gripper assembly 13$^1$, or 13$^{11}$ and the fixed grippers 17, all of which extend from the flywheel 15. The inventive gripper assemblies 13[1], 13[11] are spaced along the top of the flywheel 15 so as to clamp a substrate S that has been lowered onto the fixed grippers 17a–c (FIG. 1). The fixed grippers 17a–c are spaced along the bottom of the flywheel 15 so as to support the substrate S in a fixed position both horizontally and vertically, when the substrate S is positioned thereon.

In one aspect, the inventive gripper assembly 13, and the fixed grippers 17a–c may be positioned such that the center of the substrate S supported thereby is below the center of the flywheel 15 (e.g., 0.1–3 mm below and most preferably 1 mm below the flywheel's center) in the direction of the fixed grippers 17a–c. In this manner, as the substrate S rotates the substrate S is forced toward the fixed grippers 17a–c. Because the fixed grippers 17a–c do not open, the substrate S therefore is unlikely to become unseated as the flywheel 15 rotates.

The flywheel 15 is coupled to a motor 45 adapted to control the rotational speed of the flywheel 15. A pair of rinsing fluid nozzles 47a, 47b are coupled to a source of rinsing fluid (not shown), and may be positioned to supply rinsing fluid to he center of the front and back surfaces of the substrate S, respectively. The vertical SRD 111 may be configured as described in U.S. patent application Ser. No. 09/544,660, filed Apr. 6, 2000 (AMAT No. 3437/CMP/RKK) the entire disclosure of which is incorporated herein by this reference.

In operation, to rinse and to dry a substrate S, the flywheel 15 is placed in a predetermined position such that the base portion 25 of each of the moveable grippers 19 (FIGS. 3A–4B) is aligned in front of the pin 37 and such that the inventive gripper assemblies 13[1], 13[11] are spaced along the top of the flywheel 15. The pin 37 is driven forward and contacts the moveable gripper's base portion 25 to open the moveable gripper 19 as shown in either FIGS. 3B or 4B. A substrate handler (not shown) lowers a substrate S and places the substrate S on the fixed grippers 17a–c. The fixed grippers 17a–c may support the substrate S in a fixed position with the center of the substrate S below the center of the flywheel 15. An actuator (not shown) gradually retracts the pin 37 such that the moveable gripper 19 gradually closes, placing the end effector 29 in contact with the substrate S. As described with reference to FIGS. 3A–4B, the force between the magnets 23a–b or 39a–b maintains the inventive gripper assemblies 13 in the closed position.

Thereafter, the flywheel 15 begins to rotate. Because the substrate S's center may be offset from the flywheel 15's center in the direction of the fixed grippers 17a–c, rotation may force the substrate S firmly in the direction of the fixed grippers 17a–c. Accordingly, minimal force may be-experienced by the moveable gripper 19. Thus, the substrate S may be unlikely to become unseated from the grippers 19, 17.

The flywheel 15 initially may rotate at a slow speed (e.g., 100 to 500 revolutions per minute (rpm)) while the rinsing fluid nozzles 47a, 47b supply rinsing fluid to the center of the front and back surfaces of the substrate S. It has been found that 400 rpm provides optimal rinsing of a vertically oriented substrate, as additional energy is required to overcome the force of gravity. After the substrate S is sufficiently rinsed (e.g., approximately 12 sec.), the rinsing fluid nozzles 47a, 47b may shut off, and the motor 45 may increase the rotational speed of the flywheel 15 (e.g., to approximately 1000 to 2500 rpm) such that rinsing fluid is displaced from the substrate S via the increased rotational speed.

After the substrate S is sufficiently dry, the motor 45 slows the rotation of the flywheel 15 and eventually stops the rotation of the flywheel 15 when the flywheel 15, and optionally the substrate S, are in a known position. Specifically, the substrate S may be in the position it was in when placed in the SRD 111. The substrate S ideally may be oriented prior to entry to the SRD 111.

In this known position, the base portion 25 of the moveable grippers 19 is positioned in front of the pins 37. The actuator (not shown) then drives the pins 37 forward to contact the base portion 25 of the moveable grippers 19, thus opening the moveable grippers 19. Thereafter, a substrate handler extracts the rinsed and dried substrate S.

The foregoing description discloses only the preferred embodiments of the invention, modifications of the above-disclosed apparatus and method which fall within the scope of the invention will be readily apparent to those of ordinary skill in the art. For instance, the magnets 23, 39 may be coupled in other positions on the moveable gripper 19 and/or on the mounting base 21. Rather than being coupled to the mounting base 21, one of the magnets 23, 39 may be coupled to the flywheel 15. In fact, rather than employing a separate mounting base, the mounting base may be an integral part of the flywheel 15. The number of grippers and the specific configuration of the inventive grippers may vary. The inventive aspects may be employed by any conventional substrate spinner or handler in which wafer clamping is desired, and need not be limited to use on an SRD. As stated previously, the orientation of the inventive gripper assembly may vary as may the orientation of any flywheel, SRD or other spinner that employs the inventive gripper assembly.

An alternative embodiment may mount the moveable gripper 19 on a first side of the mounting base 21 (e.g., behind the flywheel 15) and may employ a moveable gripper 19 configured to extend around the mounting base 21 and outward from a second side of the mounting base 21 (e.g., in front of the flywheel 15). Such a configuration may maintain the grippers moving parts further from the surface of the substrate.

Finally, it will be understood that the coupling between the mounting base 21 and moveable gripper 19 may introduce friction which can be considered when selecting appropriate magnets. In order to prevent the moveable gripper 19 from either an excessive open or closed position (e.g., which may apply excessive force to the substrate) motion limiters may be employed such as a rotational motion stop coupled to the shaft 33, or a motion stop that may extend at a desired height from the flywheel 15, the mounting base 21 or the moveable gripper 19, so as to prevent a portion of the moveable gripper 19 from coming too close to the flywheel 15, etc.

Accordingly, while the present invention has been disclosed in connection with the preferred embodiments thereof, it should be understood that other embodiments may fall within the spirit and scope of the invention, as defined by the following claims.

What is claimed is:

1. A gripper assembly comprising:
    a mounting base having a first magnet coupled thereto; and
    a moveable gripper coupled to the mounting base having:
        a second magnet coupled thereto; and
        an end effector adapted to contact a wafer wherein the first and second magnets are adapted so that the magnetic force therebetween biases the end effector away from the mounting base.

2. The gripper assembly of claim 1 wherein the moveable gripper is pivotally mounted to the mounting base.

3. The gripper assembly of claim 1 wherein the magnetic force between the first magnet and the second magnet is repulsive.

4. The gripper assembly of claim 1 wherein the magnetic force between the first magnet and the second magnet is attractive.

5. The gripper assembly of claim 2 wherein the magnetic force between the first magnet and the second magnetic is repulsive.

6. The gripper assembly of claim 2 wherein the magnetic force between the first magnet and the second magnet is attractive.

7. A rotatable substrate support comprising:

a plurality of grippers, at least one of which is a gripper assembly as claimed in claim 1.

8. A rotatable substrate support comprising:

a plurality of grippers, at least one of which is a gripper assembly as claimed in claim 2.

9. A rotatable substrate support comprising:

a plurality of grippers, at least one of which is a gripper assembly as claimed in claim 3.

10. A rotatable substrate support comprising:

a plurality of grippers, at least one of which is a gripper assembly as claimed in claim 4.

11. A rotatable substrate support comprising:

a plurality of grippers, at least one of which is a gripper assembly as claimed in claim 5.

12. A rotatable substrate support comprising:

a plurality of grippers, at least one of which is a gripper assembly as claimed in claim 6.

13. A method of gripping a substrate comprising:

coupling a moveable gripper to a mounting base;

magnetically biasing the moveable gripper in a closed position; and selectively employing an actuating pin to overcome the bias and move the moveable gripper to an open position.

14. The method of claim 13 wherein coupling the moveable gripper to the mounting base comprises pivotally mounting the moveable gripper to the mounting base.

15. The method of claim 13 wherein magnetically biasing the moveable gripper comprises generating an attractive force.

16. The method of claim 13 wherein magnetically biasing the moveable gripper comprises generating a repulsive force.

17. The method of claim 14 wherein magnetically biasing the moveable gripper comprises generating an attractive force.

18. The method of claim 14 wherein magnetically biasing the moveable gripper comprises generating a repulsive force.

* * * * *